US008060472B2

(12) United States Patent
Itai et al.

(10) Patent No.: US 8,060,472 B2
(45) Date of Patent: Nov. 15, 2011

(54) INFORMATION PROCESSING SYSTEM, INFORMATION PROCESSING METHOD, AND COMPUTER-READABLE STORAGE MEDIUM

(75) Inventors: Daisuke Itai, Yokohama (JP); Kunitaka Ozawa, Utsunomiya (JP); Hiroaki Fujiwara, Utsunomiya (JP); Yoshihiro Kawauchi, Utsunomiya (JP); Hisao Nakagawa, Utsunomiya (JP); Hajime Nakamura, Hiratsuka (JP); Mitsuhiro Masuda, Utsunomiya (JP)

(73) Assignee: Canon Kabushiki Kaisha (JP)

( * ) Notice: Subject to any disclaimer, the term of this patent is extended or adjusted under 35 U.S.C. 154(b) by 0 days.

(21) Appl. No.: 12/716,393

(22) Filed: Mar. 3, 2010

(65) Prior Publication Data
US 2010/0235384 A1 Sep. 16, 2010

(30) Foreign Application Priority Data
Mar. 10, 2009 (JP) .................................. 2009-057130

(51) Int. Cl.
*G06F 7/00* (2006.01)
(52) U.S. Cl. ........ 707/638; 707/636; 707/655; 707/825; 715/229
(58) Field of Classification Search .................. 707/687, 707/638
See application file for complete search history.

(56) References Cited

U.S. PATENT DOCUMENTS
2003/0229805 A1* 12/2003 Perry ............................. 713/200
2005/0289166 A1* 12/2005 Stanley et al. ................. 707/100
2008/0208888 A1* 8/2008 Mitchell ........................ 707/102

FOREIGN PATENT DOCUMENTS
JP 07-013819 A 1/1995
JP 2004-110182 A 4/2004

OTHER PUBLICATIONS
Itai, Daisuke, et al, "Information Processing System, Information Processing Method, and Memory Medium", Specifications and Drawings of unpublished related co-pending U.S. Appl. No. 12/716,384, filed Mar. 3, 2010, pp. 1-44.

* cited by examiner

*Primary Examiner* — Shahid Alam
*Assistant Examiner* — Fazlul Quader
(74) *Attorney, Agent, or Firm* — Rossi, Kimms & McDowell LLP

(57) ABSTRACT

An information processing system which utilizes apparatus data recorded in a database in conformity with a data definition which can be updated as needed, comprises a storage unit configured to store a data definition history in which a data definition version is associated with a period for which a data definition in the data definition version is used, a data definition library configured to register a data definition version and a data definition in the data definition version in association with each other, an extractor configured to extract, from the database, apparatus data which meets an extraction condition including an extraction period designated via a user interface, and a converter configured to convert an expression of the apparatus data extracted by the extractor into an expression conforming to a data definition designated via the user interface.

8 Claims, 9 Drawing Sheets

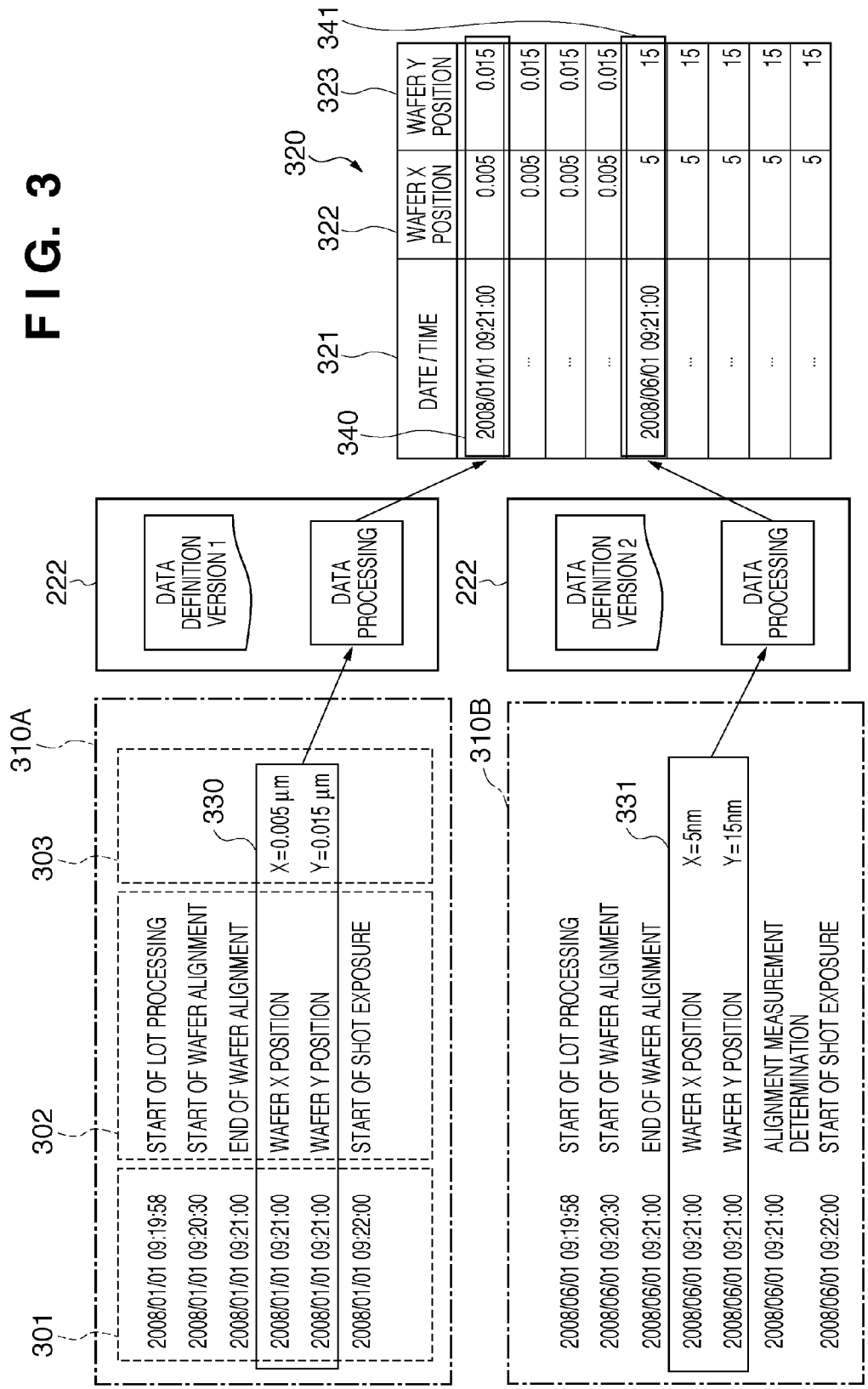

FIG. 4

```
START
  ↓
DESIGNATE EXTRACTED APPARATUS
DATA ITEM NAMES, DATA DEFINITION,    — S401
AND EXTRACTION PERIOD
  ↓
EXTRACT DATA    — S402
  ↓
RECOGNIZE DATA DEFINITION
WITHIN EXTRACTION PERIOD    — S403
  ↓
CHANGE DATA DEFINITION TO
DESIGNATED DATA DEFINITION    — S404
  ↓
END
```

| APPARATUS ID | DATA DEFINITION VERSION | START PERIOD |
|---|---|---|
| ToolA | DATA DEFINITION VERSION α | 2007/01/01 |
| | DATA DEFINITION VERSION β | 2007/06/01 |
| | DATA DEFINITION VERSION 1 | 2007/12/01 |
| | DATA DEFINITION VERSION 2 | 2008/05/05 |
| | DATA DEFINITION VERSION 3 | 2008/09/11 |
| | DATA DEFINITION VERSION 4 | 2008/11/11 |
| | DATA DEFINITION VERSION 5 | 2008/12/23 |
| ToolB | DATA DEFINITION VERSION 21 | 2005/03/01 |
| | DATA DEFINITION VERSION 22 | 2006/01/01 |
| | DATA DEFINITION VERSION 23 | 2008/03/10 |

DATA DEFINITION VERSION 1 — 223A

| ITEM NAME | FORMAT | UNIT | LOG EXTRACTION SOURCE |
|---|---|---|---|
| WAFER X POSITION | VALUE ROUNDED TO FIRST DECIMAL PLACE | μm | WAFER X POSITION |
| WAFER Y POSITION | VALUE ROUNDED TO FIRST DECIMAL PLACE | μm | WAFER Y POSITION |
| ... | ... | ... | ... |

DATA DEFINITION VERSION 2 — 223B

| ITEM NAME | FORMAT | UNIT | LOG EXTRACTION SOURCE |
|---|---|---|---|
| WAFER X POSITION | INTEGER | nm | WAFER X POSITION |
| WAFER Y POSITION | INTEGER | nm | WAFER Y POSITION |
| ... | ... | ... | ... |

DATA DEFINITION VERSION 3 — 223C

| ITEM NAME | FORMAT | UNIT | LOG EXTRACTION SOURCE |
|---|---|---|---|
| ... | ... | ... | ... |

| DATE/TIME | WAFER X POSITION | WAFER Y POSITION |
|---|---|---|
| MAY 1, 2008 | 0.8 | 1.5 |
| ... | 0.8 | 1.5 |
| ... | 0.8 | 1.5 |
| ... | 0.8 | 1.5 |
| ... | 0.8 | 1.5 |
| ... | 0.8 | 1.5 |
| ... | 0.8 | 1.5 |
| MAY 5, 2008 | 800 | 1500 |
| ... | 800 | 1500 |
| ... | 800 | 1500 |
| ... | 800 | 1500 |
| ... | 800 | 1500 |
| ... | 800 | 1500 |
| ... | 800 | 1500 |
| MAY 10, 2008 | 800 | 1500 |

FIG. 8

| DATA DEFINITION VERSION 1 | FROM MAY 1, 2008 TO MAY 4, 2008 |
|---|---|
| DATA DEFINITION VERSION 2 | FROM MAY 5, 2008 TO MAY 10, 2008 |

| | | CONVERSION DESTINATION | | | | |
|---|---|---|---|---|---|---|
| | | m | mm | μm | nm | pm |
| CONVERSION SOURCE | m | | 0.1^3 | 0.1^6 | 0.1^9 | 0.1^12 |
| | mm | 10^3 | | 0.1^3 | 0.1^6 | 0.1^9 |
| | μm | 10^6 | 10^3 | | 0.1^3 | 0.1^6 |
| | nm | 10^9 | 10^6 | 10^3 | | 0.1^3 |
| | pm | 10^12 | 10^9 | 10^6 | 10^3 | |

FIG. 11

| CONTROL SOFTWARE VERSION | DATA DEFINITION VERSION |
|---|---|
| Tool Type ○○Control Ver.1 | DATA DEFINITION VERSION 1 |
| Tool Type ○○Control Ver.2 | DATA DEFINITION VERSION 2 |
| Tool Type ○○Control Ver.3 | DATA DEFINITION VERSION 3 |
| Tool Type ○○Control Ver.4 | |
| Tool Type ○○Control Ver.5 | |

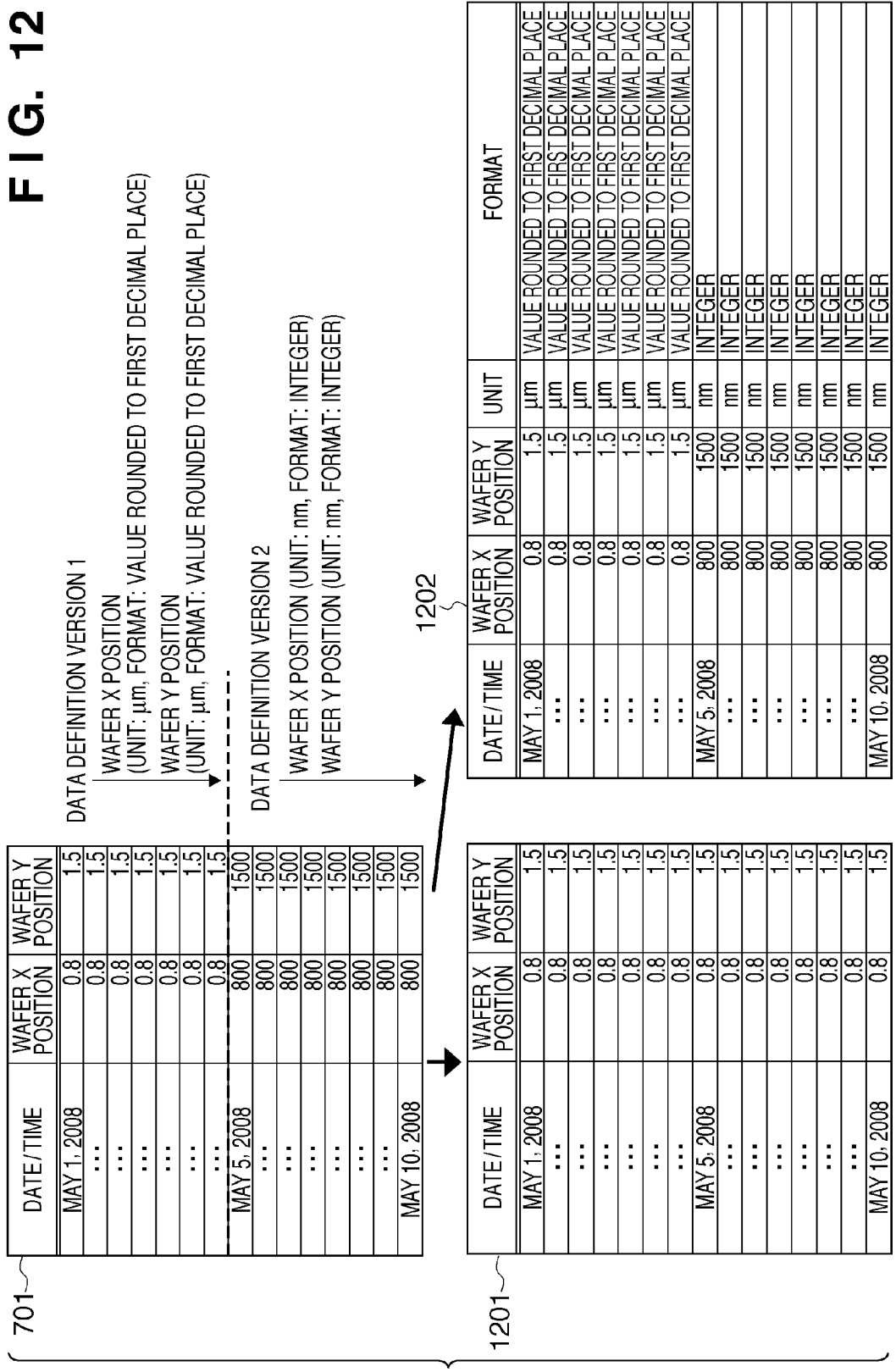

INFORMATION PROCESSING SYSTEM, INFORMATION PROCESSING METHOD, AND COMPUTER-READABLE STORAGE MEDIUM

BACKGROUND OF THE INVENTION

1. Field of the Invention

The present invention relates to an information processing system, an information processing method, and a computer-readable storage medium.

2. Description of the Related Art

A semiconductor manufacturing apparatus for manufacturing a semiconductor device can generate a large amount of apparatus data in the process of manufacturing a semiconductor device. The apparatus data can include, for example, data pertaining to events that occur in the semiconductor manufacturing apparatus, and data indicating the measurement results. The apparatus data can be recorded in a shared database and used for, for example, abnormality detection, status diagnosis, and abnormality cause analysis for the semiconductor manufacturing apparatus.

A semiconductor manufacturing apparatus is always required to form finer patterns and therefore its precision may be frequently improved by, for example, upgrading control software to control it. To keep up with this improvement, the unit and the number of significant digits of the measurement value obtained by a measurement unit mounted in the semiconductor manufacturing apparatus may be changed. When such a change takes place, it takes a lot of trouble to find and correct a portion, where the unit or the number of significant digits has changed, in analyzing the apparatus data output from the semiconductor manufacturing apparatus.

Japanese Patent Laid-Open No. 7-13819 discloses a technique of managing numerical data in combination with the unit of the numerical value, and a technique of converting the unit of the numerical data to another one in response to a unit conversion instruction. Japanese Patent Laid-Open No. 2004-110182 discloses a technique of converting data at the data extraction source so as to meet the specifications of data at the data extraction destination in accordance with the conversion process contents registered in a data conversion library and the conversion relationship defined in an item conversion map.

Unfortunately, Japanese Patent Laid-Open Nos. 7-13819 and 2004-110182 neither disclose nor suggest a technique of managing a data definition and its version in association with the period for which apparatus data is recorded in conformity with the data definition, and utilizing the managed data.

SUMMARY OF THE INVENTION

The present invention converts apparatus data extracted from a database into an expression conforming to the designated data definition and provides the converted data to the user in an information processing system that utilizes the apparatus data recorded in the database in conformity with a data definition that can be updated as needed.

One of the aspects of the present invention provides an information processing system which utilizes apparatus data recorded in a database in conformity with a data definition which can be updated as needed, the system comprising a storage unit configured to store a data definition history in which a data definition version is associated with a period for which a data definition in the data definition version is used, a data definition library configured to register a data definition version and a data definition in the data definition version in association with each other, an extractor configured to extract, from the database, apparatus data which meets an extraction condition including an extraction period designated via a user interface, and a converter configured to convert an expression of the apparatus data extracted by the extractor into an expression conforming to a data definition designated via the user interface, wherein the apparatus data is one of data generated by a semiconductor manufacturing apparatus and data obtained by processing the generated data, and the converter is configured to determine a data definition version of a data definition used within the extraction period by referring to the data definition history, to determine a data definition in the determined data definition version as a data definition of the apparatus data extracted by the extractor by referring to the data definition library, and to convert an expression of the apparatus data into an expression conforming to the designated data definition.

Further features of the present invention will become apparent from the following description of exemplary embodiments with reference to the attached drawings.

BRIEF DESCRIPTION OF THE DRAWINGS

FIG. 3 is a view illustrating apparatus data that can be generated by a data processor based on a log;

FIG. 4 is a flowchart illustrating the sequence of information processing in an information processing apparatus or an information processing system including it according to the first embodiment;

FIG. 5 is a table illustrating the data definition history;

FIG. 6 is a table illustrating the data definition;

FIG. 7 is a table illustrating the extracted apparatus data;

FIG. 8 is a table illustrating the detected data definition history;

FIG. 9 is a view illustrating a conversion table;

FIG. 11 is a table illustrating the correspondence between the control software version and the data definition version; and FIG. 12 is a table illustrating apparatus data before and after conversion in the first embodiment.

DESCRIPTION OF THE EMBODIMENTS

Preferred embodiments of the present invention will be described below with reference to the accompanying drawings.

First Embodiment

Figure 2:
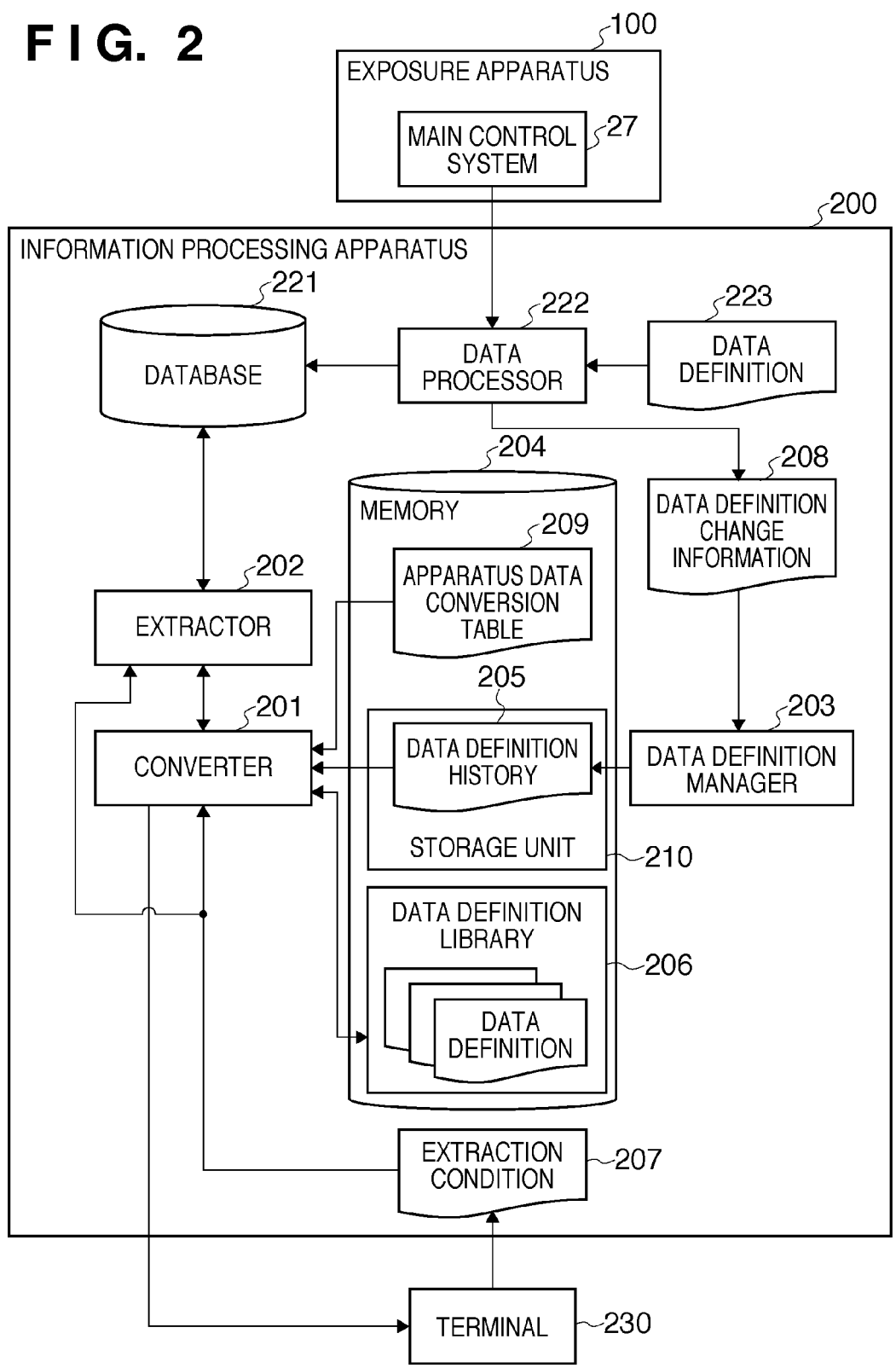
FIG. 2 is a block diagram showing the schematic configuration of an information processing system according to the first embodiment of the present invention.

An information processing system according to the first embodiment of the present invention will be explained with reference to FIG. 2. The information processing system according to the first embodiment of the present invention is configured to utilize apparatus data recorded in a database in conformity with a data definition that can be updated as needed. The information processing system includes an information processing apparatus 200 and can also typically include one or a plurality of terminals 230. The terminal 230 functions as a user interface. If the information processing apparatus 200 has a user interface function, the terminal 230 is not always necessary. The information processing apparatus 200 can be configured by one or a plurality of computers. A system including both an information processing system and a semiconductor manufacturing apparatus can be called a semiconductor manufacturing system. The term "semiconductor" includes, for example, a device in which electronic circuits are formed on a semiconductor substrate, and a flat panel display device such as a liquid crystal display. The semiconductor manufacturing apparatus can be an apparatus for manufacturing a device in which electronic circuits are formed on a semiconductor substrate. Alternatively, the semiconductor manufacturing apparatus can be an apparatus for manufacturing a flat panel display.

The information processing apparatus 200 or the information processing system is provided with apparatus data from one or a plurality of semiconductor manufacturing apparatuses (an exposure apparatus 100 in this case) via a communication interface (not shown) and a communication network (or a communication line). The apparatus data may be data that can be generated in a semiconductor manufacturing apparatus typified by the exposure apparatus 100, or data obtained by processing the generated data. Examples of semiconductor manufacturing apparatuses are the exposure apparatus 100 (to be exemplified in detail hereinafter), a deposition apparatus (for example, a plasma deposition apparatus), an etching apparatus, an annealing apparatus, an ion implantation apparatus, a cleaning apparatus, a coater/developer (coating/developing apparatus), and an inspection apparatus.

Details of the exposure apparatus 100 will be explained with reference to FIG. 1. The exposure apparatus 100 is configured to project the pattern of a reticle (original) onto a substrate such as a wafer or a plate by a projection optical system to expose the wafer. In the example shown in FIG. 1, the exposure apparatus 100 serves as a scanning exposure apparatus. It should be understood that the exposure apparatus 100 shown herein is merely one example of exposure apparatuses and is also merely one example of semiconductor manufacturing apparatuses.

In the exposure apparatus 100, a light beam output from a light source 1 has its shape and light amount distribution adjusted by an illumination optical system 2, and illuminates a reticle (original) 3 held by a reticle stage 6. The pattern of the reticle 3 is projected by a projection optical system 4 onto a wafer (substrate) 5 which is coated with a photosensitive agent (resist) and held by a wafer chuck 8 on a wafer stage 7. With this operation, a shot region on the wafer 5 is exposed and a latent image pattern corresponding to the pattern of the reticle 3 is formed (transferred) on the photosensitive agent. After latent image patterns are formed in all shot regions on the wafer 5, they are developed into a resist pattern in a development process.

The illumination optical system 2 can include, for example, a plurality of aperture stops that have different circular aperture areas and serve to set the value of the coherence factor σ. The illumination optical system 2 can also include a ring-like stop for use in annular illumination, a quadrupole stop, and a mechanism for adjusting the illumination light amount (for example, a plurality of ND filters and a mechanism for switching them). The illumination optical system 2 can moreover include a light amount detector for measuring the light amount, a slit for determining the shape of a light beam, a blind placed at a position conjugate to that of the reticle 3 in order to ensure a given illumination range, and a driving mechanism for driving the blind. The operations of the light source 1 and illumination optical system 2 are controlled in accordance with an instruction from an illumination system control system 21.

The projection optical system 4 can include a numerical aperture setting mechanism for setting the numerical aperture, and a lens driving mechanism for correcting aberration. The operation of the projection optical system 4 is controlled by a projection optical system control system 24.

The position of the reticle stage 6 in two orthogonal axial directions (X and Y directions) in a plane perpendicular to the optical axis (Z direction) of the projection optical system 4, and the rotation of the reticle stage 6 about the two axes, are measured by a reticle stage measurement system 10 and controlled by a reticle stage control system 22.

A TTR (Through The Reticle) observation optical system 9 can be inserted between the illumination optical system 2 and the reticle stage 6. The TTR observation optical system 9 can be configured to simultaneously observe both a mark on the reticle 3 or a stage reference mark formed on the reticle stage 6 and a stage reference mark on the wafer stage 7 via the projection optical system 4. The TTR observation optical system 9 can measure, for example, the positions of the reticle stage 6, reticle 3, and wafer stage 7 in the direction (Z direction) of the optical axis of the projection optical system 4 and in two orthogonal axial directions (X and Y directions) in a plane perpendicular to the optical axis, and their rotation about the two axes.

The position of the wafer 5 can be measured by a wafer stage measurement system 12 and alignment measurement system 30. The wafer stage measurement system 12 measures, for example, the position in the direction (Z direction) of the optical axis of the projection optical system 4 and in two orthogonal directions (X and Y directions) in a plane perpendicular to the optical axis, and its rotation about the two axes. The alignment measurement system 30 can measure the surface position of the wafer 5 in the direction (Z direction) of the optical axis of the projection optical system 4. A wafer stage control system 25 controls the position of the wafer stage 7 based on the pieces of information provided from the wafer stage measurement system 12 and alignment measurement system 30.

The exposure apparatus 100 can include an off-axis observation optical system 11 which can observe and measure the surface of the wafer 5 using non-exposure light. The off-axis observation optical system 11 observes a plurality of marks on the wafer 5 to measure the position and shape of the pattern on the wafer 5. The off-axis observation optical system 11 also observes the stage reference mark on the wafer stage 7 to measure the position of the stage reference mark.

Figure 1:
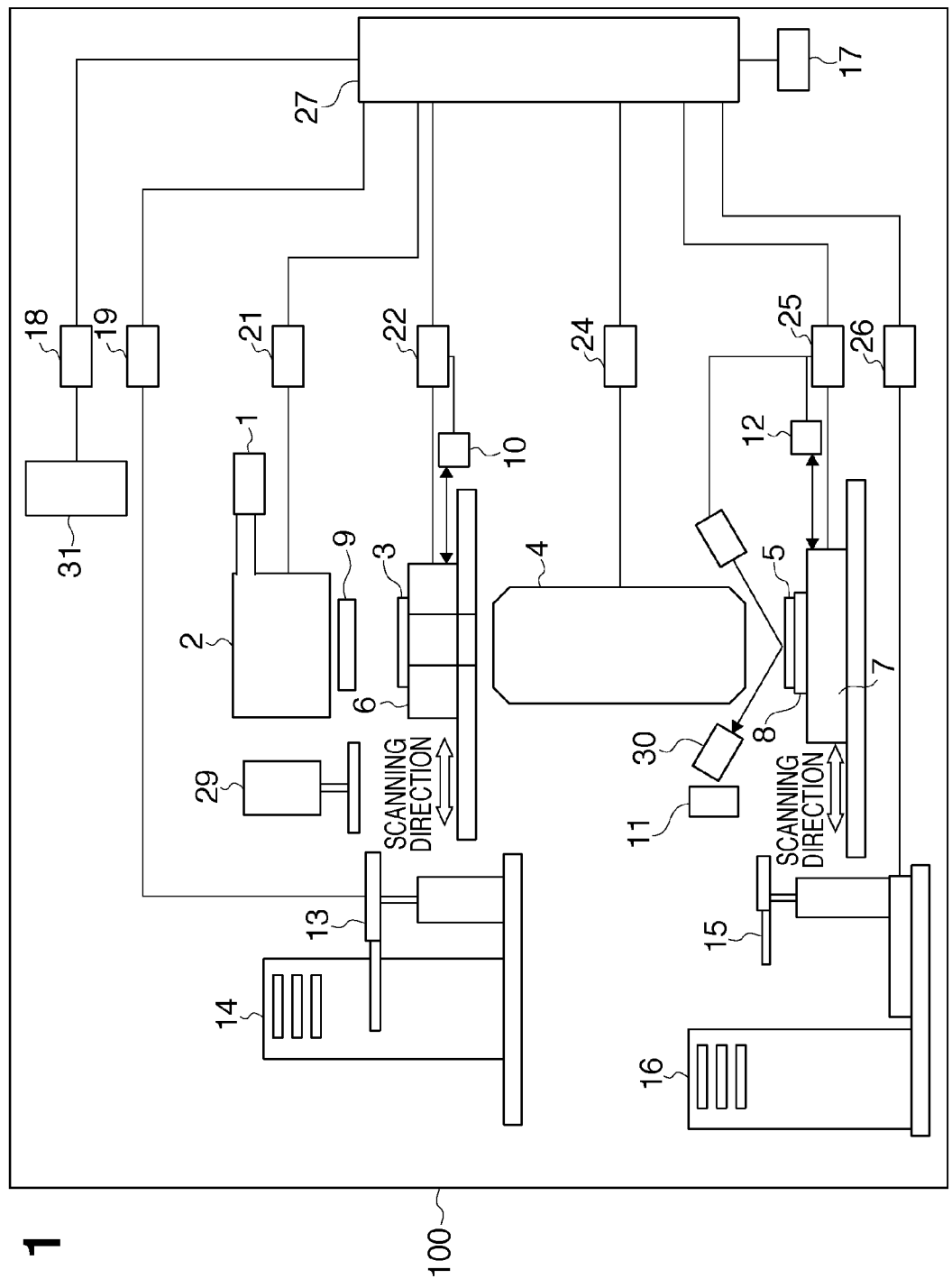
FIG. 1 is a block diagram illustrating the schematic arrangement of an exposure apparatus as one example of semiconductor manufacturing apparatuses.

During exposure of the wafer 5, the reticle 3 held by the reticle stage 6 is driven in the "scanning direction" shown in FIG. 1. In synchronism with this driving, the wafer 5 held by the wafer stage 7 is also driven in the "scanning direction" shown in FIG. 1. Note that the reticle 3 and wafer 5 are driven at a speed ratio equal to the projection magnification of the projection optical system 4. If the relative position between the reticle 3 and the wafer 5 shifts, a deformed pattern is transferred to a shot on the wafer 5. To prevent this, a main control system 27 calculates a relative positional shift between the reticle 3 and the wafer 5, and controls the reticle stage control system 22 and wafer stage control system 25 so that the relative positional shift becomes zero.

The exposure apparatus 100 can include a reticle library 14, a reticle transport unit including a reticle robot 13, and a reticle alignment unit 29 for aligning the position of the reticle 3 with the mark on the reticle stage 6. The reticle transport unit operates in accordance with an instruction from a reticle transport control system 19. The exposure apparatus 100 can also include a wafer cassette elevator 16 and a wafer transport unit including a wafer loading/unloading robot 15. The wafer transport unit operates in accordance with an instruction from a wafer transport control system 26.

A chamber environment controller 31, for example, maintains constant the temperature of the air within a chamber that accommodates the main part of the exposure apparatus 100, and eliminates any minute foreign particles by a filter. The chamber environment controller 31 operates in accordance with an instruction from a chamber control system 18.

The main control system 27 controls constituent components of the exposure apparatus 100, such as the chamber control system 18, reticle transport control system 19, wafer transport control system 26, reticle stage control system 22, wafer stage control system 25, illumination system control system 21, and projection optical system control system 24. The main control system 27 can acquire setting parameters that define the exposure operation of the exposure apparatus 100 or operation instructions for the exposure apparatus 100 via a communication interface 17, and control each constituent component of the exposure apparatus 100 based on the acquired information.

An exposure process is performed in accordance with job parameters that define the operation of the exposure apparatus 100. The job parameters include, for example, the process name (job name), the lot ID, the shot range, the shot array, the number of each shot, the exposure dose, the exposure scanning speed, the exposure scanning direction, the calibration items of units which constitute the exposure apparatus, and the wafer and shot alignment scheme.

The main control system 27 performs an exposure process while controlling each constituent component of the exposure apparatus 100 based on the job parameters for each lot by setting one or a plurality of wafers as one lot. First, a reticle and wafer for use in an exposure process are loaded into the exposure apparatus 100 at the start of lot processing. After the loading of a reticle and wafer is completed, the main control system 27 calibrates the constituent components of the exposure apparatus 100, which are designated by job parameters, and performs measurement for alignment between the reticle and the wafer. The main control system 27 exposes each shot region on the wafer by the step & scan scheme while controlling each constituent component based on the calibration and alignment measurement results.

Simultaneously with the exposure process, the main control system 27 generates a log that records the operation of the exposure apparatus 100 during the exposure process. The log not only records, for example, the start/end events of the operation of each constituent component, the process setting values, the calibration and alignment measurement results, the exposure dose results of shot regions, the scanning operation control results, and events such as errors generated in the exposure apparatus, but also records the times at which these events occur. The main control system 27 performs a target process in accordance with control software that defines the process, and the contents recorded in the log can also be defined by the control software. The control software is assigned with a version identifier every time it is changed.

A method of determining, when apparatus data is extracted from a database 221 whose data definition can differ for each period because of arbitrary updating, the data definition of the apparatus data based on the extraction period, and converting the apparatus data extracted from the database 221 in conformity with the data definition will be explained below.

The information processing apparatus 200 can be configured to process apparatus data provided from the exposure apparatus 100. The information processing apparatus 200 can be configured by, for example, installing a computer program on a general-purpose computer. The computer program can be stored in a computer-readable storage medium. By installing the computer program, the information processing apparatus 200 operates as an apparatus that includes a communication interface (not shown), a converter 201, an extractor 202, a data definition manager 203, a memory 204, the database 221, and a data processor 222. Alternatively, by installing the computer program, the information processing apparatus 200 operates as an apparatus that executes, for example, a communication step, conversion step, extraction step, data definition management step, and storage step.

The extractor 202 extracts, from the database 221, apparatus data corresponding to the extraction condition required by the terminal 230 and sends or provides it to the terminal 230. Note that the extraction condition includes at least the extraction period and can additionally include, for example, the apparatus data item names.

The converter 201 determines, the data definition version within one or a plurality of periods included in the extraction period (the period to extract apparatus data) included in the extraction condition required by the terminal 230, based on a data definition history 205 in the memory 204. The converter 201 also determines the data definition within one or a plurality of periods included in the extraction period included in the extraction condition required by the terminal 230 by referring to a data definition library 206. The converter 201 converts the apparatus data from an expression conforming to the data definition when it is recorded in the database 221 to that conforming to the data definition required by the terminal 230, and sends or provides the converted data to the terminal 230.

The data definition manager 203 generates or updates the data definition history 205 based on data definition change information 208 obtained by the data processor 222, and records it in a storage unit 210 whose area is defined within the memory 204. The data definition history 205 may be generated for each exposure apparatus. Generation of a data definition history will be explained herein. To generate a data definition history, every time the data definition is changed, the data processor 222 provides the definition version number of a changed data definition 223 and the date/time at which the data definition 223 starts to be used to the data definition manager 203 as the data definition change information 208. The data definition manager 203 generates or updates a data definition history 205, as illustrated in FIG. 5, based on the data definition change information 208, and records it in the memory 204. In this embodiment, the memory 204 not only includes the storage unit 210 which stores the data definition history 205 but also the data definition library 206 which registers a data definition version and the data definition in the data definition version in association with each other. The data definition library 206 can be updated by the data definition manager 203. The data definition manager 203 can register a new data definition 223 in the data definition library 206 in association with the data definition version of the new data definition 223 in accordance with, for example, a change in data definition (an input of the data definition 223).

The data processor 222 processes a log, which is generated by the exposure apparatus 100 (main control system 27) and provided to the information processing apparatus 200, in conformity with the data definition 223 to generate apparatus data, and records it in the database 221. At this time, a log, which is generated by the exposure apparatus 100 (main control system 27) and provided to the information processing apparatus 200, may be recorded in the database 221 intact as apparatus data. In this case, the exposure apparatus 100 converts raw data into a log in a format conforming to the data definition 223, so the data processor 222 can record the log provided from the information processing apparatus 200 in the database 221 intact. A case in which the data processor 222 processes a log, which is generated by the exposure apparatus 100 (main control system 27) and provided to the information processing apparatus 200, in conformity with the data definition 223 to generate apparatus data will be exemplified herein.

The data definition 223 defines, for example, item names assigned to respective data indicating events and measurement values included in a log generated by the main control system 27, the formats to record the respective data, and the units of the respective data. The data definition 223 is assigned with a version number every time it is changed. FIG. 3 illustrates apparatus data that can be generated by the data processor 222 based on a log. Each of logs 310A and 310B exemplifies a log generated by the main control system 27 and includes a process time 301, operation record identifier 302, and record content 303. The data definition defines, for example, a data storage array 320 to store data on an item corresponding to the operation record identifier 302, a date/time field 321 to store the process time 301, and a content field 322 to store the record content 303.

Assume that the log 310A is generated by the main control system 27 when control software executed by the main control system 27 is "Tool Type 00 Control Ver. 1". Then, the data processor 222 records information 330 within the log 310A in the database 221 as apparatus data 340 in conformity with the data definition in a data definition version "data definition version 1".

Assume that the control software is changed to "Tool Type 00 Control Ver. 2" in response to a change in period of time. The log 310B is recorded in the database 221 as apparatus data conforming to the format defined by "Tool Type 00 Control Ver. 2". The difference between the control software "Tool Type 00 Control Ver. 1" and the control software "Tool Type 00 Control Ver. 2" lies in that the units of the wafer X position and wafer Y position are changed from µm to nm. To cope with this difference, the data definition version is changed to "data definition version 2". The data processor 222 records information 331 that constitutes the log 310B in the database 221 as apparatus data 341 in conformity with data definition version 2.

The apparatus data generated by the data processor 222 is recorded in the database 221, together with information, which determines the exposure apparatus 100, such as an apparatus recognition ID. To generate a data definition history, when the data definition is changed, the data processor 222 provides the data definition change information 208 which records the definition version number of the changed data definition and the date/time at which the changed data definition starts to be used to the data definition manager 203. The data definition may differ for each exposure apparatus, and the data definition manager 203 may be provided with the data definition change information 208, together with information that determines an exposure apparatus.

The sequence of information processing in the information processing apparatus 200 or an information processing system including it according to the first embodiment will be explained with reference to FIG. 4. In step S401, the apparatus recognition ID, the apparatus data item names to be extracted, and the extraction period are provided from the terminal 230 to the information processing apparatus 200 as an extraction condition 207 to extract the apparatus data of the target exposure apparatus 100. The start/end events of each process operation, events such as error events, and the operation results or the measurement results, for example, can be designated as the apparatus data item names to be extracted. For example, an apparatus having an apparatus recognition ID "Tool A" can be designated as the exposure apparatus 100 to be extracted, and the "wafer X position" and "wafer Y position" can be designated as the item names to be extracted. Also, the period from May 1, 2008 to May 10, 2008 can be designated as the period to be extracted. Also in step S401, a target data definition (for example, the unit and format) is input from the terminal 230. The target data definition may be designated for each apparatus data item name to be extracted or may be determined by designating the data definition version. A case in which a data definition version "data definition version 1" is designated will be exemplified herein.

In step S402 (extraction step), the extractor 202 extracts apparatus data, which meets the apparatus data item names designated in step S401 within the period designated in step S401, from the database 221. FIG. 7 illustrates extracted apparatus data 701.

In step S403 (determination step), the converter 201 determines the data definition version within the designated extraction period by referring to the data definition history 205 pertaining to "Apparatus Tool A" recorded in the memory 204. FIG. 5 illustrates the data definition history 205. A case in which, for example, the period from May 1, 2008 to May 10, 2008 is designated as the extraction period will be considered. In this case, "data definition version 1" is determined as the data definition version in the period from May 1, 2008 to May 4, 2008. Also, "data definition version 2" is determined as the data definition version in the period from May 5, 2008 to May 10, 2008. FIG. 8 illustrates the data definition version change history for each period, which is detected when the period from May 1, 2008 to May 10, 2008 is designated as the extraction period. Also in step S403, the converter 201 determines the data definition for the apparatus data item names to be extracted in the data definition version for each determined period by referring to the data definition library 206.

FIG. 6 illustrates the data definition. The data definition library 206 registers data definitions such as data definitions 223A to 223C. The units and formats of the apparatus data item names "wafer X position" and "wafer Y position" are determined based on "data definition version 1" and "data definition version 2" as data definition versions for respective determined periods. In this example, in "data definition version 1", the units of the "wafer X position" and "wafer Y position" are determined as "µm", and the format is determined as a "value rounded to the first decimal place". Also, in "data definition version 2", the units of the "wafer X position" and "wafer Y position" are determined as "nm", and the format is determined as an "integer".

In step S404 (conversion step), the converter 201 converts the expression of the apparatus data extracted by the extractor 202 in step S402 into that conforming to the data definition (for example, the unit and format) designated in step S401. At this time, if the data definition at the conversion destination (after conversion) is designated by a data definition version, a data definition corresponding to the data definition version is determined for each apparatus data item name to be extracted by referring to the data definition library 206. In this example, as described above, "data definition version 1" is designated as the conversion destination and the expression of the extracted apparatus data is converted so that the units of the "wafer X position" and "wafer Y position" become "µm" and the format (display format) becomes a "value rounded to the first decimal place". This conversion can be done by referring to a conversion table 209 describing conversion rules. The conversion table 209 can include at least one of a conversion rule to convert apparatus data conforming to the unit at the conversion source into that conforming to the unit at the conversion destination, and a conversion rule to convert apparatus data conforming to the numerical expression such as the number of significant digits at the conversion source into that conforming to the numerical expression at the conversion destination. FIG. 9 illustrates the conversion table 209 including the conversion rule to convert apparatus data conforming to the unit at the conversion source into that conforming to the unit at the conversion destination. FIG. 12 illustrates apparatus data before and after conversion in the first embodiment. The extracted apparatus data 701 is converted into a conversion result 1201.

The converter 201 may add, to the extracted apparatus data 701, information on the data definition (for example, the unit and format) for each period for which the apparatus data 701 is recorded. In this case, the unit and format of the apparatus data need not always be converted. As a result, the extracted apparatus data 701 becomes data to which information is added as indicated by a result 1202.

Second Embodiment

Figure 10:
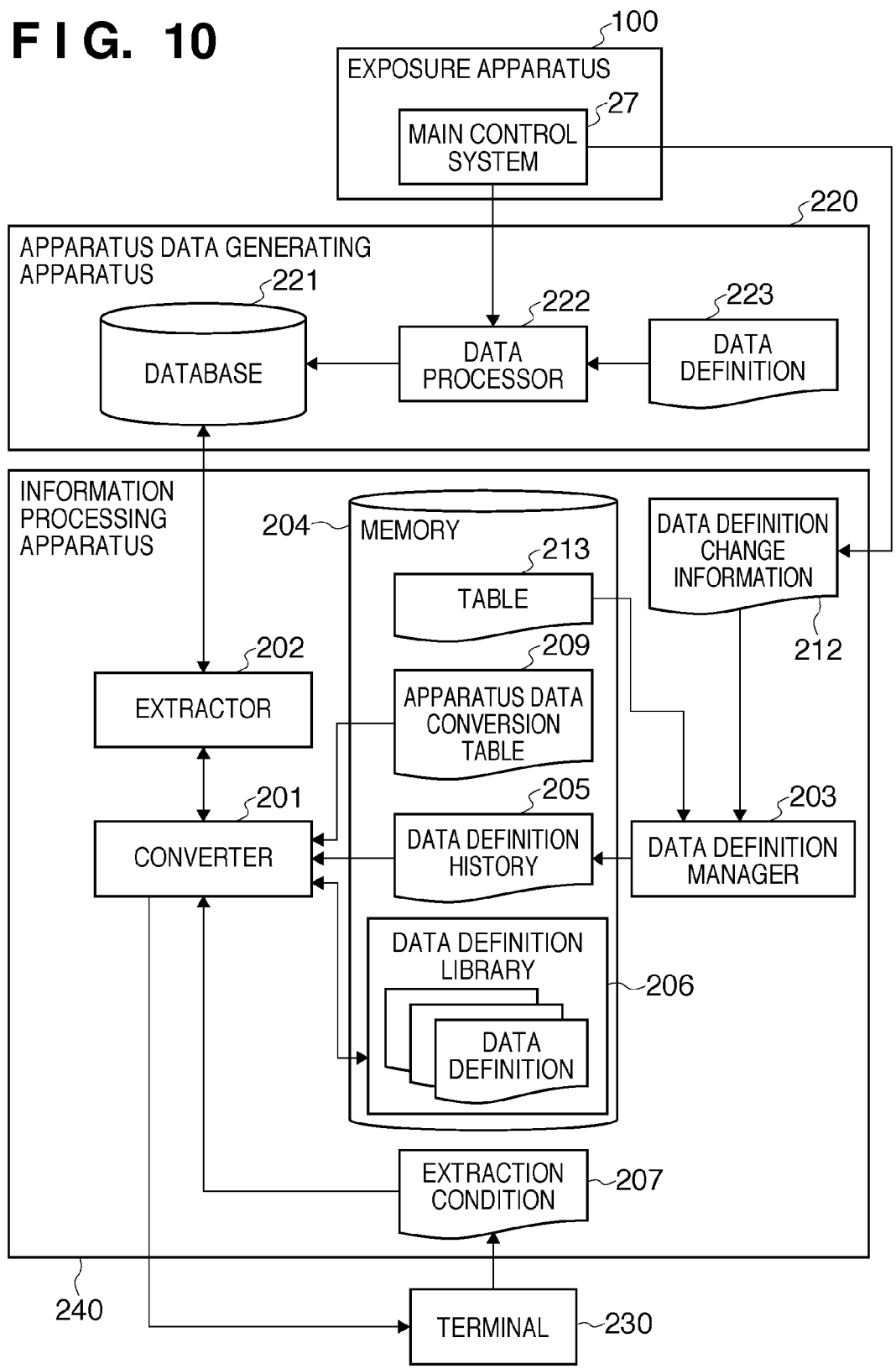
FIG. 10 is a block diagram showing the schematic configuration of an information processing system according to the second embodiment of the present invention.

The second embodiment of the present invention will be described below, and details which are not particularly referred to herein can be the same as in the first embodiment. An information processing system according to the second embodiment will be explained with reference to FIG. 10. The information processing system according to the second embodiment of the present invention includes an apparatus data generating apparatus 220 and information processing apparatus 240 and can also typically include one or a plurality of terminals 230. The terminal 230 functions as a user interface. If the information processing apparatus 240 has a user interface function, the terminal 230 is not always necessary. The information processing apparatus 240 can be configured by one or a plurality of computers. A system including both an information processing system and a semiconductor manufacturing apparatus can be called a semiconductor manufacturing system. The information processing apparatus 240 or the information processing system is provided with apparatus data from one or a plurality of semiconductor manufacturing apparatuses (an exposure apparatus 100 in this case) via a communication interface (not shown) and a communication network (or a communication line).

In the second embodiment, a data definition history 205 is generated or updated by a data definition manager 203 based on the version change information of the control software of a main control system 27. The apparatus data generating apparatus 220 is configured as an apparatus having functions corresponding to the communication interface (not shown), database 221, and data processor 222 of the information processing apparatus 200 in the information processing system according to the first embodiment shown in FIG. 2. The apparatus data generating apparatus 220 generates apparatus data based on a log sent from the exposure apparatus 100 and records it in the database 221. The information processing apparatus 240 is configured as an apparatus having functions corresponding to the communication interface (not shown), converter 201, extractor 202, data definition manager 203, and memory 204 of the information processing apparatus 200 in the information processing system according to the first embodiment shown in FIG. 2. The information processing apparatus 240 processes the apparatus data recorded in the database 221 of the apparatus data generating apparatus 220.

When the version of control software executed by the main control system 27 is changed, the main control system 27 provides information which determines the changed version and the date/time at which system operation is started using the changed version to the data definition manager 203 as control software version change information 212. The apparatus data generating apparatus 220 generates apparatus data in conformity with the data definition in a data definition version compatible with a new control software version in accordance with a change in control software version of the main control system 27. The memory 204 records a table 213 describing the correspondence between the control software version and the data definition version. For example, the data definition in a data definition version compatible with the control software version may be provided from the main control system 27 of the exposure apparatus 100 to the information processing apparatus 240 or provided to the information processing apparatus 240 via an input device set in the information processing apparatus 240.

The data definition manager 203 generates the data definition history 205 based on the table 213. FIG. 11 illustrates the correspondence between the control software version and the data definition version. For example, control software "Tool Type 00 Control Ver. 3" is assumed to correspond to data definition version 3. A case in which the control software is changed from "Tool Type 00 Control Ver. 2" to "Tool Type 00 Control Ver. 3" will be considered. In this case, the data definition manager 203 records the change date/time in the data definition history 205 as the date/time at which data definition version 3 starts to be used. A case in which the control software is changed from "Tool Type 00 Control Ver. 3" to "Tool Type 00 Control Ver. 4" will be considered. Because data definition version 3 corresponds to both "Tool Type 00 Control Ver. 3" and "Tool Type 00 Control Ver. 4", the data definition version is not changed and naturally is not recorded in the data definition history 205.

A method of converting apparatus data extracted from the database 221 into an expression conforming to the designated data definition and providing the converted data to the user is the same as that explained with reference to FIG. 4.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-057130, filed Mar. 10, 2009, which is hereby incorporated by reference herein in its entirety.

What is claimed is:

1. An information processing system which utilizes apparatus data recorded in a database in conformity with a data definition which can be updated as needed, the system comprising:

a storage unit configured to store a data definition history in which a data definition version is associated with a period for which a data definition in the data definition version is used, the data definition history being updated in accordance with updating of the data definition;

a data definition library configured to register a data definition version and a data definition in the data definition version in association with each other;

an extractor configured to extract, from the database, apparatus data which meets an extraction condition including an extraction period designated via a user interface; and a converter configured to convert an expression of the apparatus data extracted by the extractor into an expression conforming to a data definition designated via the user interface, wherein the apparatus data is one of data generated by a semiconductor manufacturing apparatus and data obtained by processing the generated data, and the converter is configured to determine a data definition version of a data definition used within the extraction period by referring to the data definition history, to determine a data definition in the determined data definition version as a data definition of the apparatus data extracted by the extractor by referring to the data definition library, and to convert an expression of the apparatus data into an expression conforming to the designated data definition.

2. The system according to claim 1, further comprising:
a conversion table including a conversion rule to convert an expression of apparatus data,
wherein the converter converts an expression of apparatus data by referring to the conversion table.

3. The system according to claim 2, wherein the conversion table includes at least one of a conversion rule to convert apparatus data conforming to a unit at a conversion source into apparatus data conforming to a unit at a conversion destination, and a conversion rule to convert apparatus data conforming to a numerical expression at a conversion source into apparatus data conforming to a numerical expression at a conversion destination.

4. The system according to claim 1, further comprising:
a data definition manager configured to update the data definition history in accordance with a change in data definition.

5. The system according to claim 4, wherein the data definition manager registers a new data definition in the data definition library in association with a data definition version of the new data definition in accordance with a change in data definition.

6. The system according to claim 4, wherein the data definition manager updates the data definition history in accordance with a change in control software of the semiconductor manufacturing apparatus.

7. An information processing method in an information processing system which utilizes apparatus data recorded in a database in conformity with a data definition which can be updated as needed,
the information processing system including a storage unit configured to store a data definition history in which a data definition version is associated with a period for which a data definition in the data definition version is used, and a data definition library configured to register a data definition version and a data definition in the data definition version in association with each other, wherein the data definition history is updated in accordance with updating of the data definition,
the apparatus data being one of data generated by a semiconductor manufacturing apparatus and data obtained by processing the generated data, and
the information processing method comprising the steps of:
extracting, from the database, apparatus data which meets an extraction condition including an extraction period designated via a user interface;
determining a data definition version of a data definition used within the extraction period by referring to the data definition history, and determining a data definition in the determined data definition version as a data definition of the apparatus data extracted in the extracting step by referring to the data definition library; and
converting an expression of the apparatus data extracted in the extracting step into an expression conforming to a data definition designated via the user interface.

8. A computer-readable storage medium storing a program which causes an information processing system to execute a process for utilizing apparatus data recorded in a database in conformity with a data definition which can be updated as needed,
the information processing system including a storage unit configured to store a data definition history in which a data definition version is associated with a period for which a data definition in the data definition version is used, and a data definition library configured to register a data definition version and a data definition in the data definition version in association with each other, wherein the data definition history is updated in accordance with updating of the data definition,
the apparatus data being one of data generated by a semiconductor manufacturing apparatus and data obtained by processing the generated data, and
the program causing the information processing system to execute a process comprising the steps of:
extracting, from the database, apparatus data which meets an extraction condition including an extraction period designated via a user interface;
determining a data definition version of a data definition used within the extraction period by referring to the data definition history, and determining a data definition in the determined data definition version as a data definition of the apparatus data extracted in the extracting step by referring to the data definition library; and
converting an expression of the apparatus data extracted in the extracting step into an expression conforming to a data definition designated via the user interface.

* * * * *